(12) United States Patent
Van Munster

(10) Patent No.: US 7,723,155 B2
(45) Date of Patent: May 25, 2010

(54) METHOD FOR THE TREATMENT OF A SURFACE OF A METAL-CARBIDE SUBSTRATE FOR USE IN SEMICONDUCTOR MANUFACTURING PROCESSES AS WELL AS SUCH A METAL-CARBIDE SUBSTRATE

(75) Inventor: Marcus Gerardus Van Munster, Tilburg (NL)

(73) Assignee: Xycarb Ceramics B.V., Helmond (NL)

( * ) Notice: Subject to any disclaimer, the term of this patent is extended or adjusted under 35 U.S.C. 154(b) by 0 days.

(21) Appl. No.: 10/883,516

(22) Filed: Jun. 30, 2004

(65) Prior Publication Data

US 2006/0001028 A1    Jan. 5, 2006

(51) Int. Cl.
  *H01L 21/00* (2006.01)
  *H01L 31/0312* (2006.01)
(52) U.S. Cl. .................. 438/105; 438/931; 257/77
(58) Field of Classification Search .......... 438/105, 438/268, 273, 494, 498, 504, 931; 117/95, 117/97; 257/77
  See application file for complete search history.

(56) References Cited

U.S. PATENT DOCUMENTS

| | | | | |
|---|---|---|---|---|
| 5,178,977 | A * | 1/1993 | Yamada et al. | 430/5 |
| 6,214,107 | B1 * | 4/2001 | Kitabatake | 117/95 |
| 6,579,833 | B1 * | 6/2003 | McNallan et al. | 508/100 |
| 6,589,337 | B2 * | 7/2003 | Hisada et al. | 117/95 |
| 6,617,244 | B2 * | 9/2003 | Nishizawa | 438/637 |
| 6,841,436 | B2 * | 1/2005 | Hisada et al. | 438/197 |

(Continued)

FOREIGN PATENT DOCUMENTS

WO    WO 01/45148 A1    6/2001

(Continued)

OTHER PUBLICATIONS

Ersoy, D.A., et al, "High Temperature Chlorination of SiC for Preparation of Tribological Carbon Films," *Procedings of the Symposium on High Temperature Corrosion and Materials Chemistry*, vol. 98-9, 1998, pp. 324-333.

(Continued)

*Primary Examiner*—Ori Nadav
(74) *Attorney, Agent, or Firm*—Haynes and Boone, LLP

(57) ABSTRACT

The invention relates to a method for the treatment of a surface of a silicon carbide (SiC) substrate, said substrate being used in semiconductor manufacturing processes. The invention also relates to a SiC substrate for use in semiconductor manufacturing processes treated with the method according to the invention. According to the invention, said method comprising the steps of selective etching the surface of said SiC substrate using a reactive gas mixture, thereby creating a carbon surface layer on said substrate, and removing said carbon surface layer being created on said substrate. Thus, with the method steps according to the invention, SiC substrates can be obtained with a surface structure that complies with the highest standards as regard to dimensions and purity as required in semiconductor manufacturing processes. In particular, SiC substrates treated according to the steps of the invention are highly suitable for use as wafer boats for handling and containing semiconductor wafers on which subsequent treatment process steps of the semiconductor manufacturing processes (such as semiconductor layer deposition or temperature annealing) are performed under accurate, well controlled working conditions (temperature, pressure and vacuum).

11 Claims, 1 Drawing Sheet

(Continued)

U.S. PATENT DOCUMENTS

| | | | |
|---|---|---|---|
| 6,960,535 B1* | 11/2005 | Sato | 438/738 |
| 2001/0047980 A1* | 12/2001 | McNallan et al. | 216/75 |
| 2002/0033130 A1 | 3/2002 | Hisada et al. | |
| 2005/0000406 A1* | 1/2005 | Janzen et al. | 117/81 |
| 2005/0257571 A1* | 11/2005 | Koaizawa et al. | 65/397 |

FOREIGN PATENT DOCUMENTS

WO      WO 02/086180 A2     10/2002

OTHER PUBLICATIONS

Gogotsi, Y.G., "Carbon coatings on silicon carbide by reaction with chlorine-containing gases," *Journal of Materials Chemistry*, The Royal Society of Chemistry, Cambridge, GB, vol. 7, No. 9, Sep. 1, 1997, pp. 1841-1848.

Jeon, I.D., et al, Formation of Carbon Coatings on Silicon Carbide by Reactions in Halogen Containing Media, *Proceedings on the Symposium on Fundamental Aspects of High Temperatures*, vol. 96-26, 1997, pp. 256-268.

Bi Zhan, "Subsurface Evaluation of Ground Ceramics", University of Connecticut, Jan. 10, 1995( pp. 263-266).

Hockin H.K.Xu, "Effect of Microstructure on Material-Removable Mechanisms and Damage Tolerance in Abrasive Machining of Silicon Carbide", J.Am.Ceram.Soc. 78 [9] (pp. 2443-2448).

* cited by examiner

METHOD FOR THE TREATMENT OF A SURFACE OF A METAL-CARBIDE SUBSTRATE FOR USE IN SEMICONDUCTOR MANUFACTURING PROCESSES AS WELL AS SUCH A METAL-CARBIDE SUBSTRATE

FIELD OF THE INVENTION

The invention relates to a method for the treatment of a surface of silicon carbide (SiC) substrates of a type used in semiconductor manufacturing processes. The invention also relates to silicon carbide substrates for use in semiconductor manufacturing processes treated with the method according to the invention.

BACKGROUND OF THE INVENTION

Silicon carbide (SiC) substrates are known for their use in semiconductor manufacturing processes. More particularly, SiC is used as starting material from which, for example, wafer boats or support rings are constructed. Such constructions serve as a holder and positioning means for multiple wafers, which wafers are subjected to several treatment steps during semiconductor fabrication. Such treatment process steps are performed under specific, well controlled conditions as regards to temperature, pressure and vacuum and can be the deposition of several semiconductor material layers on said wafers, for example using chemical vapor deposition techniques (CVD) or other process steps, such as temperature annealing.

It should be noted in this patent application that the term "silicon carbide substrates" includes not only wafer boat holders, but also other constructions or components made from a SiC material, which are used in semiconductor manufacturing processes, for example, in reactor vessels.

As the subsequent treatment process steps of the semiconductor manufacturing processes (such as semiconductor layer deposition) takes place under accurately controlled circumstances as regard as temperature, pressure and vacuum and also require so-called clean room environments needs to fulfill the highest standard as regard to purity and lack of contaminations, also the SiC substrates need to fulfill to the highest standard as regard to dimensions and thermal behavior.

To this end, the several SiC substrate components which form, for example, a wafer boat holder, are subjected to a mechanical machining operation in order to treat the substrate surface. However the surface treatment by means of a mechanical machining operation results in small, nearly invisible microcracks or holes in the surface of the SiC substrates. These microcracks or subsurface damage adversely affects the different subsequent semiconductor manufacturing processes (e.g., the semiconductor layer deposition or high temperature anneal) as all kinds of contaminations may accumulate in said microcracks, which contaminations can be freed from said micro cracks during the semiconductor process, thereby contaminate the semiconductor layer deposition on the wafers. The latter will result in significantly reduced quality or rejection of products.

A further drawback of the presence of subsurface damage on the SiC substrate is the risk of particle generation and emission during the semiconductor manufacturing processes. Due to the changing thermal conditions during the several semiconductor layer depositions, small SiC particles will come loose from the substrate and hence, contaminate the semiconductor manufacturing process.

It is an object of the invention to provide a method and a silicon carbide substrate as mentioned above which obviates the above-identified drawbacks. According to the invention, said method comprising the steps of selective etching the surface of said SiC substrate using a reactive gas mixture, thereby creating a carbon surface layer on said substrate, and removing said carbon surface layer created on said substrate.

Thus, with the method steps according to the invention, SiC substrates can be obtained with a surface structure that complies with the highest standards as regard to dimensions and purity as required in semiconductor manufacturing processes. Especially, SiC substrates treated according to the steps of the invention are highly suitable for use as wafer boats for handling and containing semiconductor wafers on which subsequent treatment process steps of the semiconductor manufacturing processes (such as semiconductor layer deposition or temperature annealing) are performed under accurate, well controlled working conditions (temperature, pressure and vacuum).

As all subsurface damage in the form of microcracks is removed with the removal of the carbon surface layer, a smooth and clean SIC surface is obtained having an extremely high purity, as also all impurities are removed. Furthermore, due to the removal of the subsurface damaged surface, the generation and emission of particles from the SiC surface, which particles may adversely affect the semiconductor manufacturing process, is herewith avoided.

Hence, with a SiC substrate treated with the method according to the invention, a higher degree of purity can be obtained during semiconductor manufacturing processes with a higher level of accuracy and lesser rejection of products.

In a specific embodiment of the method according the invention is the step of removing said carbon surface layer performed by means of an oxidation treatment technique.

In another embodiment of the method according to the invention is the step of removing said carbon surface layer performed by means of a hydrogenation treatment technique. In another embodiment, the step of removing said carbon surface layer is performed by means of a hydrothermical treatment technique.

Moreover, in an advantageous embodiment of the invention, a functional etching technique the reactive gas mixture being used during the step of etching the surface of said SiC substrate is a halogen-containing gas mixture, wherein the halogen-containing gas concentration of said reactive gas mixture can be 100%.

In another embodiment according to the invention, the halogen-containing gas is chlorine ($Cl_2$), for example, in an Argon-environment.

Furthermore, in another advantageous embodiment with an excellent etching performance, the reactive gas mixture also contains hydrogen ($H_2$).

In an example, the flow rate of said reactive gas mixture is 0.5-5 liters per minute, whereas, the working pressure of said reactive gas mixture may lie between 100 mbar and the ambient pressure, and wherein the working temperature of said reactive gas mixture may lie between 1000° C. and 1200° C.

The SiC substrate for use in semiconductor manufacturing processes is, according to the invention, characterized in that said SiC substrate comprising a surface, wherein on said surface a carbon surface layer is formed by means of an etching technique using a reactive gas mixture, which carbon surface layer is subsequently removed from said substrate.

Likewise is in an specific embodiment of the SiC substrate according to the invention, said carbon surface layer removed by means of an oxidation treatment technique. Or said carbon surface layer can be removed by means of a hydrogenation treatment technique.

Likewise said carbon surface layer can be removed by means of a hydrothermical treatment technique.

In a specific embodiment of the SiC substrate according to the invention, said SiC substrate surface is subjected to a reactive gas mixture consisting of a reactive gas mixture containing a halogen-containing gas mixture.

Furthermore, in a more specific embodiment, said halogen-containing gas concentration of said reactive gas mixture is 100%, and more in particular, said halogen-containing gas is chlorine ($Cl_2$) in an Ar-environment. Furthermore, the reactive gas mixture may also contain hydrogen ($H_2$).

Likewise the flow rate of said reactive gas mixture may lie between 0.5-5 liters per minute, whereas said SiC substrate surface may be subjected to a working pressure of said reactive gas mixture between 100 mbar and the ambient pressure, or whereas said SiC substrate surface is subjected to a working temperature of said reactive gas mixture between 1000° C. and 1200° C.

BRIEF DESCRIPTION OF THE DRAWINGS

The invention shall now be described by means of a drawing, which drawing shows in.

DETAILED DESCRIPTION OF THE PREFERRED EMBODIMENTS

Figure 1A:
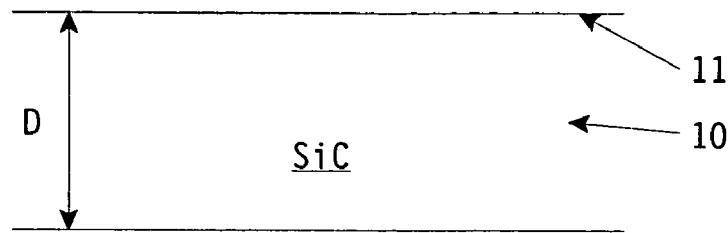
FIG. 1a-1d, an embodiment of a silicon carbide substrate according to the invention, when subjected or treated with the method according to the invention.
Figure 1B:
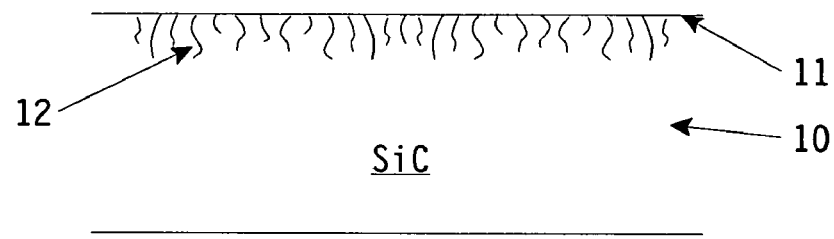
Figure 1C:
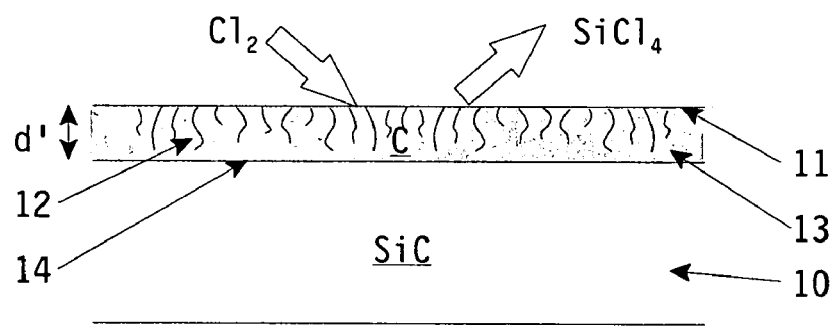
Figure 1D:
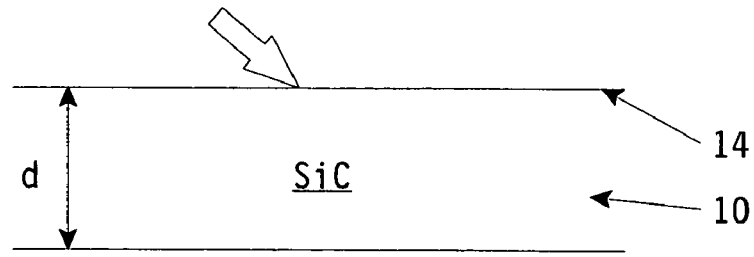

In FIG. 1a, a silicon carbide (SiC) substrate 10 is disclosed with thickness D, which substrate 10 is frequently used in semiconductor manufacturing processes. Silicon carbide is used as starting material from which, for example, wafer boats or support rings are constructed. Such constructions serve as a holder and positioning means for multiple wafers, which wafers are subjected to several treatment steps during semiconductor fabrication. Such treatment process steps are performed under specific, well controlled conditions as regards to temperature, pressure and vacuum, and can be the deposition of several semiconductor material layers on said wafers, for example, using chemical vapor deposition techniques (CVD) or other process steps, such as temperature annealing.

As already described in the introductory part of the patent application, such SiC substrates are often subjected to a surface treatment, wherein the surface 11 is subjected by a mechanical machining operation in order to obtain a smooth surface 11 that fulfills certain requirements concerning dimensions, smoothness and purity.

A drawback of a mechanical surface treatment, such as machining, is that in surface 11, multiple, nearly non-visible small microcracks 12 are created, also called subsurface damage.

This subsurface damage adversely affects the semiconductor manufacturing process, as all kinds of contaminations present in the microcracks 12 may diffuse out of the microcracks into the clean room environment where the wafers are subjected to subsequent semiconductor layer deposition steps. The contaminations present in the microcracks 12 may therefore adversely affect the quality and yield of the wafers being processed.

According to the invention, the method for the treatment of the surface of the SiC substrate 10 comprises the step of etching the surface 11 of said substrate 10 using a reactive gas mixture, thereby creating a carbon surface layer 13 on said substrate 10.

The reactive gas mixture consists of a halogen-containing gas component having a concentration of, for example, 100%. The reactive gas mixture may also contain a lower halogen-containing gas concentration, as long as the halogen concentration is high enough to react with the surface 11 of the SiC substrate 10. The halogen-containing gas component can be any chemical from the group of halogens, for example, of chlorine ($Cl_2$) in an Ar-environment, wherein Ar (argon) is used as a carrier gas. Also, hydrogen ($H_2$) can be used as a carrier gas.

Due to the exposure of the subsurface damaged surface 11 of the SiC substrate 10 with the reactive halogen-containing gas mixture, the halogen-containing gas (pure halogen or a halogen mixture) reacts with the metal-carbide according to the following reaction (1):

$$SiC + 2Cl_2 \Psi SiCl_4 + C \qquad (1)$$

In this example, chlorine gas ($Cl_2$) is used as the reactive halogen-containing component of the reactive gas mixture for the treatment of a silicon-carbide (SiC) substrate 10, but also other halogens or halogen-containing gases or as-mixtures can be used (such as $F_2$, $Br_2$ and $I_2$).

In another embodiment, the reactive gas mixture may contain HCl, which reacts with the silicon carbide according to the following reaction (2):

$$SiC + 4HCl \Psi SiCl_4 + C + 2H_2 \qquad (2)$$

According to the reaction between the reactive halogen-containing gas mixture with the SiC substrate surface 11, a carbon layer 13 is formed, the depth d' being dependent from the time interval during which the etching step is performed. The depth d' (or the transition layer 14 between the carbon layer 13 and the substrate 10) needs to be significantly large (deep) in order to cover all microcracks 12 (subsurface damage) present in the surface 11 of the substrate 10.

The depth of the transition layer 14 (the thickness d' of the carbon-layer 13) is dependent of the etching time and/or the etching conditions (temperature, pressure and halogen-concentrations).

Preferably, the working temperature of the etching step lies between 1000° till 1200° C., wherein the flow rate of the reactive gas mixture of chlorine $Cl_2$ lies between 0.5-5 liters per minute. The working pressure may lie between 100 mbar till the ambient pressure.

When the etching step is performed in a halogen environment, all kinds of contaminations present on the surface 11 or in the microcracks 12 of the SiC substrate 10 are removed.

In a subsequent method step according to the invention, the carbon surface layer 13 being created on said SiC substrate 10 is removed, for example using an oxidation treatment technique.

According to another embodiment of said latter method step, the carbon surface layer can be removed by means of a hydrogenation or hydrothermical treatment technique.

Also, mechanical removal steps can be performed, such as blasting or polishing, as long as the new SiC layer 14 remains undamaged in order to avoid the same problems as encountered before the etching step of the method according to the invention is being performed.

The removal step of the carbon surface layer 13 may take place at working temperatures between 100° C. till 4000° C. under pressure conditions which may be vacuum till 4000 bar.

As a result of the latter removal step of the carbon surface layer 13, a SiC substrate 10' with a smaller thickness d is obtained with a smooth surface 14 that fulfills the highest requirements as regards to smoothness, and said substrate 10' also exhibits a much higher degree of purity. Due to the absence of any subsurface damage, no contaminations can adhere or are present on the surface 14, nor any generation and emission of particles can occur during the semiconductor manufacturing processes due to the absence of microcracks in which such particles can be present.

The invention claimed is:

1. Method for the treatment of a surface of a silicon carbide substrate to remove subsurface damage in the form of microcracks extending into the silicon carbide substrate to a specific maximum depth, said silicon carbide substrate being used as a support construction in semiconductor manufacturing processes, said method comprising the steps of:

selectively etching the surface of said silicon carbide substrate in a single step using a reactive gas mixture so as to create a carbon surface layer on said silicon carbide substrate, said carbon surface layer having a thickness at least equal to the specific maximum depth of the microcracks; and, completely removing all carbon, including the thickness of said carbon surface layer, from the surface of said silicon carbide substrate so as to produce a clean, carbon free silicon carbide surface on said substrate, thereby removing all subsurface microcrack damage from said silicon carbide substrate.

2. The method according to claim 1, wherein the step of removing all of said carbon is performed by means of an oxidation treatment technique.

3. The method according to claim 1, wherein the step of removing all of said carbon is performed by means of a hydrogenation treatment technique.

4. The method according to claim 1, wherein the step of removing all of said carbon is performed by means of a hydrothermical treatment technique.

5. The method according to claim 1, wherein the reactive gas mixture being used during the step of etching the surface of said silicon carbide substrate is a halogen-containing gas mixture.

6. The method according to claim 5, wherein the halogen-containing gas concentration of said reactive gas mixture is 100%.

7. The method according to claim 5, wherein the halogen-containing gas is $Cl_2$ in an Ar-environment.

8. The method according to claim 5, wherein the reactive gas mixture also contains hydrogen ($H_2$).

9. The method according to claim 1, wherein the flow rate of said reactive gas mixture is 0.5-5 liters per minute.

10. The method according to claim 1, wherein the working pressure of said reactive gas mixture lies between 100 mbar and the ambient pressure.

11. The method according to claim 1, wherein the working temperature of said reactive gas mixture lies between 1000° C. and 1200° C.

* * * * *